United States Patent [19]

Cachier

[11] 4,333,076

[45] Jun. 1, 1982

[54] ULTRA-HIGH FREQUENCY SIMULTANEOUS TRANSMISSION AND RECEPTION HEAD, MILLIMETER WAVE TRANSMITTER - RECEIVER AND RADAR USING SUCH A HEAD

[75] Inventor: Gerard Cachier, Paris, France

[73] Assignee: Thomson-CSF, Paris, France

[21] Appl. No.: 157,344

[22] Filed: Jun. 9, 1980

[30] Foreign Application Priority Data

Jun. 12, 1979 [FR] France ............................ 79 14990

[51] Int. Cl.³ .............................................. G01S 13/04
[52] U.S. Cl. .................. 343/5 DD; 333/137; 343/5 PD; 343/8
[58] Field of Search ............ 333/125, 137; 343/5 DD, 343/5 TM, 5 PD, 8

[56] References Cited

U.S. PATENT DOCUMENTS 3,448,822  6/1969  LaLone et al. .................. 343/8 X
3,955,194  5/1976  Chua ........................................ 343/8
4,035,797  7/1977  Nagy .................................. 343/8 X

*Primary Examiner*—T. H. Tubbesing
*Attorney, Agent, or Firm*—Oblon, Fisher, Spivak, McClelland & Maier

[57] ABSTRACT

A millimeter wave transmitting and receiving head having an excellent technical quality, which is inexpensive to produce and has minimum overall dimensions. The head has for example a guide with a square cross-section connected by a duplexer provided with fins to two guides having rectangular cross-sections and with crossed polarizations. One of the rectangular guides is semicircular so that it can receive through an opening an orifice of the other rectangular guide. A symmetrical mixer having two diodes receives the signal from the two guides and has two outputs. A Gunn diode-type or avalanche-type oscillator serves as the transmitter and the local signal generator. The head is completed by a receiving amplifier and an antenna for constituting a transmitter-receiver. A radar can be obtained by addition of a quarter-wave plate level with antenna.

5 Claims, 3 Drawing Figures

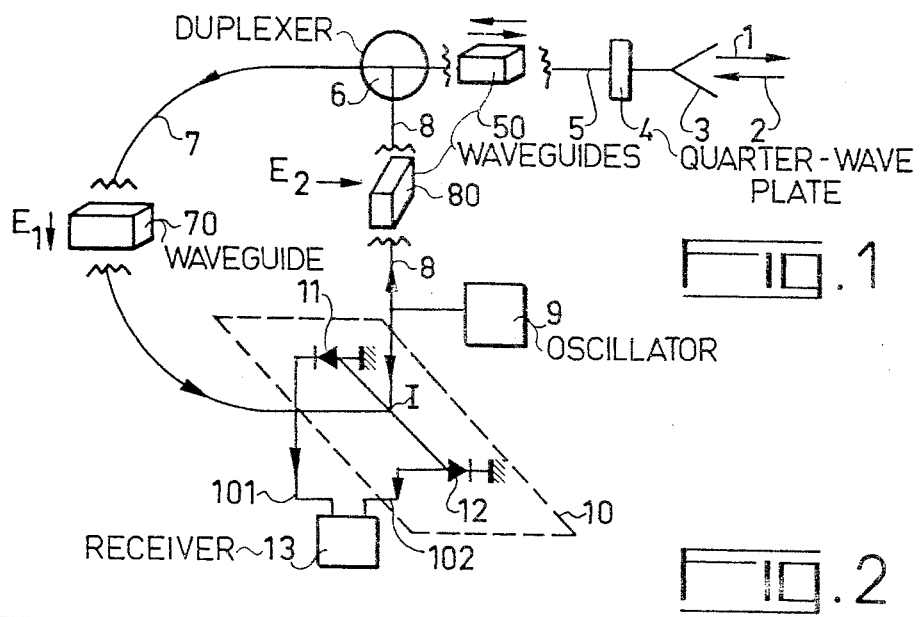
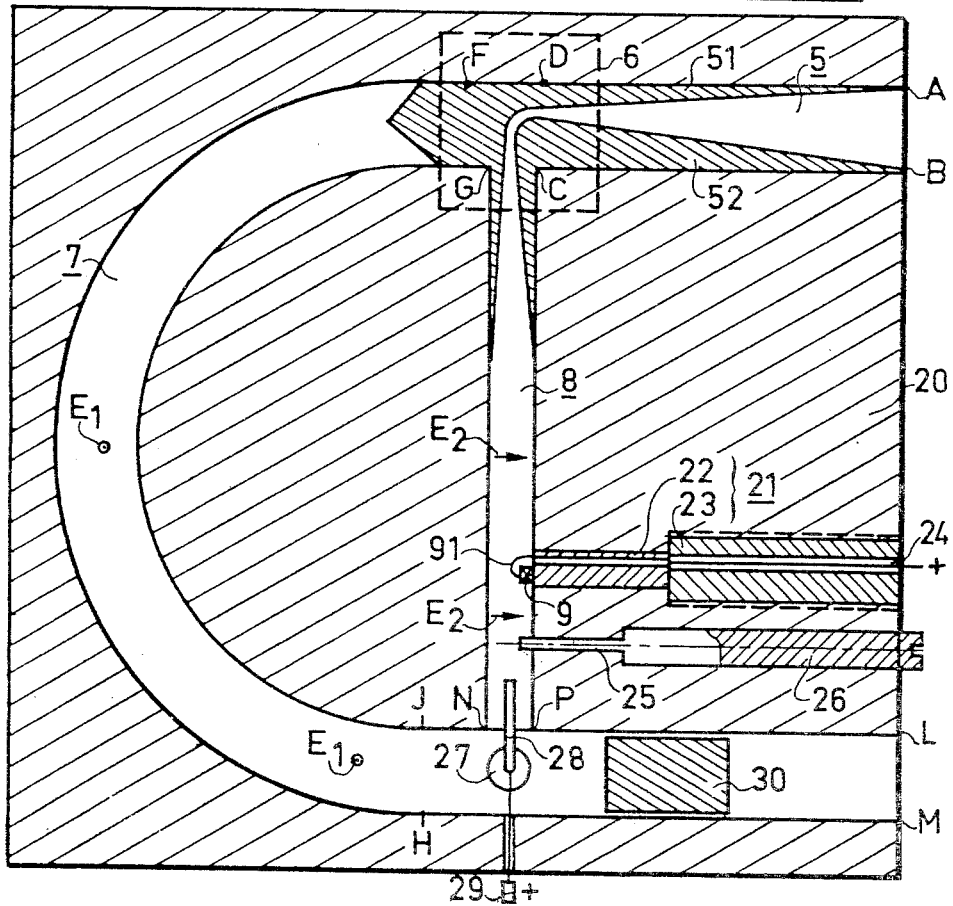

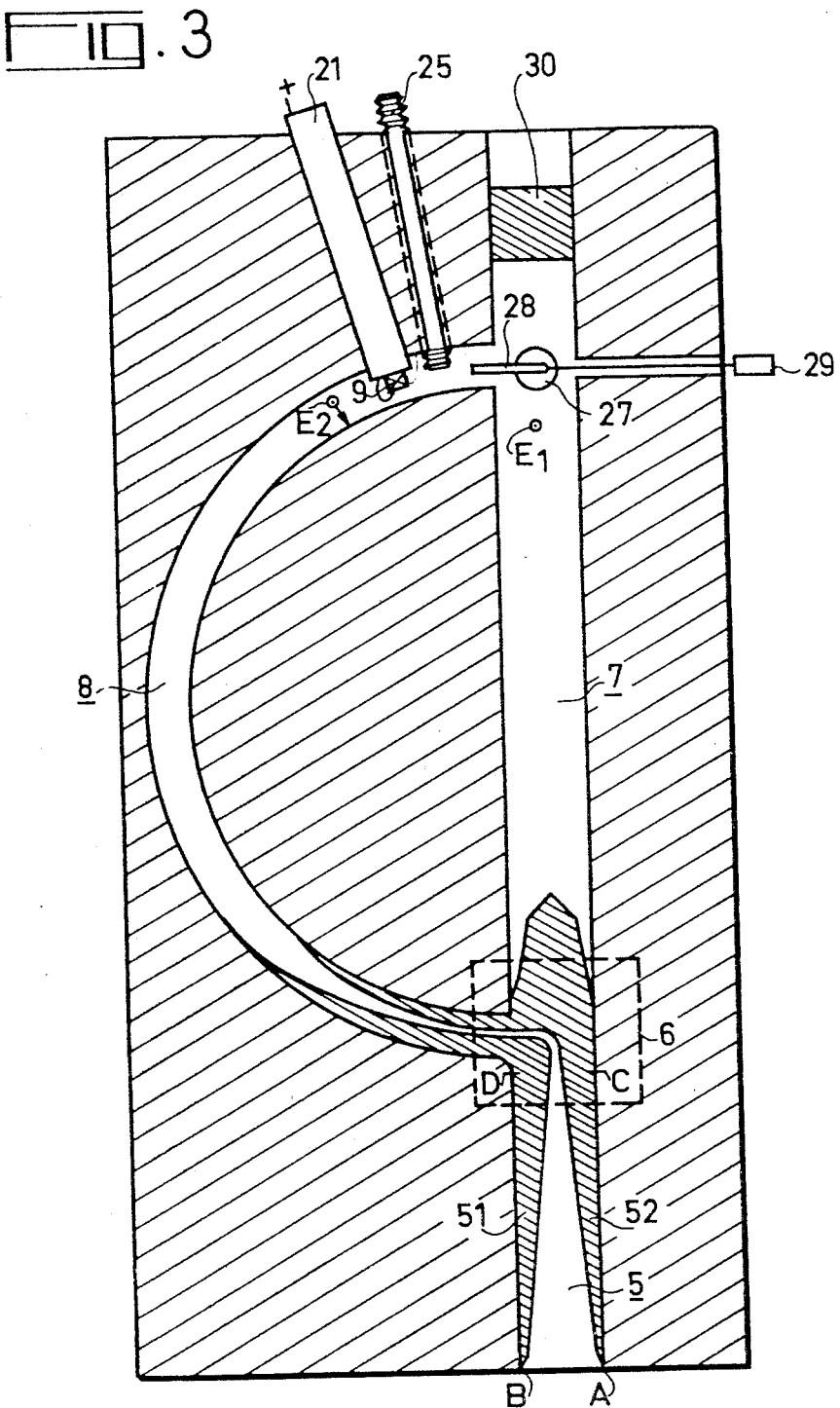

ULTRA-HIGH FREQUENCY SIMULTANEOUS TRANSMISSION AND RECEPTION HEAD, MILLIMETER WAVE TRANSMITTER - RECEIVER AND RADAR USING SUCH A HEAD

BACKGROUND AND SUMMARY OF THE INVENTION

The invention relates to an ultra-high frequency simultaneous transmission and reception head, as well as to a transmitter-receiver and a millimeter wave radar using such a head.

The object of the invention is to produce on an industrial scale and using relatively simple and inexpensive means a compact, high performance transmitter-receiver, this particularly applying to the signal-to-noise ratio on reception.

The ultra-high frequency head according to the invention comprises at least one millimeter wave oscillator which can be used both as a transmission source and as a local oscillator, a polarization duplexer and a symmetrical mixer, whose outputs are to be connected to the inputs of a receiving amplifier. The ultra-high frequency head incorporates two guides having a rectangular cross-section connected to the different outputs of the duplexer and which intersect at an intersection in the vicinity of which is located the mixer, the oscillator being coupled to one of the guides and the mixer either being directly coupled to the other guide or incorporated in the latter, the rectangular cross-sections of the guides level with the said intersection being arranged in such a way that the electrical components of the electromagnetic fields are orthogonal.

BRIEF DESCRIPTION OF THE DRAWINGS

The invention is described in greater detail hereinafter relative to non-limitative embodiments and the attached drawings, wherein show:

FIG. 1 a diagram of the invention.

FIG. 2 a section through the head according to the invention.

FIG. 3 a sectional view like that of FIG. 2 of a variant of the invention.

DETAILED DESCRIPTION OF THE PREFERRED EMBODIMENTS

A transmitter-receiver (FIG. 1) has for example an oscillator 9 which simultaneously serves as a transmission source and a local oscillator, a duplexer 6, a symmetrical mixer 10 and a receiver 13. Duplexer 6 and mixer 10 are represented by conventional symbols. Oscillator 9 and receiver 13 are indicated by rectangles.

Two guides 7 and 8 are connected in crossed polarizations to the duplexer 6, which is itself connected to a third guide 5 having a square cross-section and indicated by a symbolic section 50. In the latter are propagated in reverse directions the transmission and reception waves with mutually orthogonal polarizations.

The symbolic sections 70 and 80 represented on interruptions of guides 7 and 8 show that the small sides of the guides are orthogonal. At the coupling point of the two guides, the electrical components $E_1$ and $E_2$ of the electromagnetic fields are parallel to the small sides of the cross-sections of the guides and are therefore orthogonal.

The transmitter-receiver is completed by a so-called quarter-wave plate 4 which serves to convert in conventional manner linear polarization into circular polarization and vice versa. The presence of this plate is only optional and serves to permit the use of the ultra-high frequency head in radar.

For example, a horn-type antenna 3 is connected to guide 5. Arrows 1 and 2 indicate the millimeter waves propagating in opposite directions externally of the head.

In operation, the wave 1 produced by oscillator 9 is propagated by guide 8 onto duplexer 6 where it is branched to guide 5 and from there to antenna 3. It does not interfere with wave 2 of the signal to be received directly by a circular arc portion to point I where the mixer 10 also receives by coupling with guide 8, using not shown means, the electromagnetic field of the local signal from oscillator 9. Outputs 101 and 102 of the mixer are connected to a receiver 13 which forms the difference or the sum of the detected signals depending on whether they are in phase or in phase opposition.

In a communication between two transmitters-receivers according to the invention, steps are taken to ensure the perpendicularity of the polarizations of the electromagnetic fields of waves 1 and 2. If the apparatuses are similarly installed, one of the guides 5 must be helically twisted by 90° on one of the transmitters-receivers.

The head of the transmitter-receiver diagrammatically shown in FIG. 1, incorporates a block 20 (FIG. 2) constructed in partly disassemblable manner according to the technology of ultra-high frequency cavities and circuits. The three guides 5, 7 and 8 of the circuit of FIG. 1 are integrated into the said blocks. Guide 5 having a square cross-section extends over a portion ABCD and has fins 51 and 52 facilitating the guidance of the electrical field in duplexer 6. Guide 7 with a rectangular cross-section (small side of the rectangle perpendicular to the sectional plane of FIG. 2) having a portion FGHJ bent in a U-shaped manner and a straight portion HJLM. Guide 8 which has a rectangular cross-section (small side of the rectangle parallel to the plane of FIG. 2) extends over a portion CGNP.

In the intersection plane of portions 7 and 8, an opening NP is made in guide 7 and in exemplified manner said opening can precisely correspond to the intersection of the two guides.

The symbolically represented ultra-high frequency oscillator 9 is introduced into guide 8 by a support 21 having a threaded sleeve 23 screwed into block 20 and a rod 22 which slides in an appropriate perforation of block 20. The oscillator is for example a Gunn diode, whereof one electrode is at earth and the other is energised by a polarization connection 91 forming a radiant loop in guide 8 and which also traverses rod 22 and sleeve 23 by a pipe 24.

The oscillator can also comprise a module having a conductive support, a semiconducting diode, for example, an avalanche diode in contact with the said support by one of its electrodes, a layer of dielectric material placed on the said support and surrounding the diode and a metal coating deposited on the layer and in contact with the other electrode of the diode.

Finally, a dielectric screw 25 carried by a mandrel 26 emerges in the section of guide 8. By regulating the projecting height of this screw it is possible to correct possible mismatches between oscillator and guide.

The symmetrical guide mixer, incorporating for example, two head-to-tail diodes enclosed in the facing modules by their metal coating 27, is directly coupled to the electrical component $E_1$ of the electromagnetic field of the signal to be received and, by means of conductive strips 28 (whereof only one is shown) to the component $E_2$ of the local signal. The output signals of the mixer are collected on electrodes 29 (of which only one is shown), also serving to connect the polarizations.

A conductive member forming amovable plug 30 permits to match the guides to get the best signal levels in the mixer.

FIG. 3 shows a variant of the head of FIG. 2 and in which the same members carry the same reference numerals. However, the guide 7 of the signal to be received is in this case straight and is placed in the extension of guide 5, whilst guide 8 is bent in U-shaped manner. The mixer is located in guide 7. Thus, there is a permutation of the rectangular guides connected to the duplexer.

We claim:

1. An ultra-high frequency head comprising:
   a microwave oscillator which can be used both as a transmission source and as a local oscillator;
   a polarization duplexer having a first, a second and a third port, said first port opening onto a two-way square cross-section guide destined to be connected with transmitting and/or receiving antenna, said second port opening onto a first rectangular cross-section guide coupled with said microwave oscillator and having a straight longitudinal shape, and said third port opening onto a second rectangular cross-section guide having a shape bent in such a manner that it intersects with said first rectangular guide, the rectangular cross-section of both rectangular guides being arranged so as to have the electrical components of the electrical fields to be orthogonal in first and second retangular guides;
   a mixer situated in said second rectangular guide in the vicinity of the intersection of said first and second rectangular guides.

2. An ultra-high frequency head comprising:
   a microwave oscillator which can be used both as a transmission source and as a local oscillator;
   a polarization duplexer having a first, a second and a third port, said first port opening onto a two-way square cross-section guide destined to be connected with transmitting and/or receiving antenna, said second port opening onto a first rectangular cross-section guide coupled with said microwave oscillator and having a bent longitudinal shape, and said third port opening onto a second rectangular cross-section guide having a straight longitudinal shape and intersecting with said first rectangular guide, the rectangular cross-section of both rectangular guides being arranged so as to have the electrical components of the electrical fields to be orthogonal in first and second rectangular guides;
   a mixer situated in said second rectangular guide in the vicinity of the intersection of said first and second rectangular guides.

3. A head accordinfg to claim 1 or 2, wherein the mixer has two diodes enclosed in two modules arranged in such a way that their metal coatings face one another.

4. A head according to claim 1 or 2, wherein the oscillator is constituted by a negative resistance module having a conductive support, a semiconductor diode in contact with said support by one of its electrodes, a layer of dielectric material placed on the support and surrounding the diode and a metal coating deposited on the layer and which is in contact with the other electrode of the diode.

5. A head according to claim 1 or 2, wherein the oscillator, duplexer and mixer, as well as the wave guides connected to the duplexer are incorporated in the same block.

* * * * *

UNITED STATES PATENT AND TRADEMARK OFFICE
CERTIFICATE OF CORRECTION

PATENT NO. : 4,333,076
DATED : June 1, 1982
INVENTOR(S) : Gerard Cachier

It is certified that error appears in the above—identified patent and that said Letters Patent is hereby corrected as shown below:

Please correct the following:

[54] -- ULTRA-HIGH FREQUENCY SIMULTANEOUS TRANSMISSION AND RECEPTION HEAD, MILLIMETRE WAVE TRANSMITTER-RECEIVER AND RADAR USING SUCH A HEAD --

Signed and Sealed this

Tenth Day of August 1982

[SEAL]

Attest:

GERALD J. MOSSINGHOFF

Attesting Officer

Commissioner of Patents and Trademarks